(12) United States Patent
Song

(10) Patent No.: US 10,416,796 B2
(45) Date of Patent: Sep. 17, 2019

(54) EXPANDABLE DISPLAY DEVICE

(71) Applicant: BOE TECHNOLOGY GROUP CO., LTD., Beijing (CN)

(72) Inventor: Song Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 3 days.

(21) Appl. No.: 15/512,577

(22) PCT Filed: Feb. 18, 2016

(86) PCT No.: PCT/CN2016/073996
§ 371 (c)(1),
(2) Date: Mar. 20, 2017

(87) PCT Pub. No.: WO2016/161845
PCT Pub. Date: Oct. 13, 2016

(65) Prior Publication Data
US 2018/0018033 A1 Jan. 18, 2018

(30) Foreign Application Priority Data
Apr. 7, 2015 (CN) .......................... 2015 1 0160727

(51) Int. Cl.
G06F 3/041 (2006.01)
H01L 51/00 (2006.01)
(Continued)

(52) U.S. Cl.
CPC ............ G06F 3/041 (2013.01); G06F 1/1652 (2013.01); H01L 27/323 (2013.01);
(Continued)

(58) Field of Classification Search
CPC .... G06F 3/041; G06F 1/1652; G06F 3/04886; G06F 2203/04102; H01L 51/0097; H01L 51/5237; H01L 27/323
See application file for complete search history.

(56) References Cited

U.S. PATENT DOCUMENTS 7,558,057 B1    7/2009  Naksen et al.
2009/0051830 A1 2/2009  Matsushita et al.
(Continued)

FOREIGN PATENT DOCUMENTS

CN    101171621 A    4/2008
CN    101329609 A    12/2008
(Continued)

OTHER PUBLICATIONS

First Office Action for Chinese Application No. 201510160727.0, dated Sep. 2, 2016, 8 Pages.
(Continued)

Primary Examiner — Kwang-Su Yang
(74) Attorney, Agent, or Firm — Brooks Kushman P.C.

(57) ABSTRACT

A display device including a display panel and a touch panel is provided. At least one of the display panel and the touch panel is made of a flexible material. The display device is capable of being switched between a first usage state where a portion of the touch panel overlaps a portion of the display panel so that a touch operation is capable of being performed, through the touch panel, on at least a portion of an image displayed on the display panel, and a second usage state where the display panel is located at a side of the touch panel and does not overlap the touch panel and a button pattern is formed on the touch panel through which an operation is performed on the image displayed on the display panel.

14 Claims, 4 Drawing Sheets

(51) Int. Cl.
*H01L 51/52* (2006.01)
*H01L 27/32* (2006.01)
*G06F 3/0488* (2013.01)
*G06F 1/16* (2006.01)

(52) U.S. Cl.
CPC ...... *H01L 51/0097* (2013.01); *H01L 51/5237* (2013.01); *G06F 3/04886* (2013.01); *G06F 2203/04102* (2013.01)

(56) References Cited

U.S. PATENT DOCUMENTS

| | | |
|---|---|---|
| 2010/0033435 A1 | 2/2010 | Huitema |
| 2011/0018820 A1* | 1/2011 | Huitema ............... G06F 1/1601 345/173 |
| 2011/0148797 A1 | 6/2011 | Huitema et al. |
| 2013/0058063 A1* | 3/2013 | O'Brien ............... G06F 1/1624 361/807 |
| 2013/0127917 A1* | 5/2013 | Kwack ................ G06F 1/1652 345/660 |
| 2014/0194165 A1 | 7/2014 | Hwang |
| 2015/0095826 A1 | 4/2015 | Ahn et al. |
| 2016/0037672 A1 | 2/2016 | Zhang et al. |
| 2016/0282971 A1* | 9/2016 | Zenner ................ B32B 37/10 |

FOREIGN PATENT DOCUMENTS

| | | |
|---|---|---|
| CN | 102057342 A | 5/2011 |
| CN | 103716428 A | 4/2014 |
| CN | 103929530 A | 7/2014 |
| CN | 203759584 U | 8/2014 |
| CN | 104102333 A | 10/2014 |
| CN | 104715682 A | 6/2015 |
| JP | 2013127539 A | 6/2013 |

OTHER PUBLICATIONS

Second Office Action for Chinese Application No. 201510160727.0, dated Apr. 1, 2017, 9 Pages.
International Search Report and Written Opinion for Application No. PCT/CN2016/073996, dated May 17, 2016, 13 Pages.

* cited by examiner

EXPANDABLE DISPLAY DEVICE

CROSS-REFERENCE TO RELATED APPLICATIONS

This application is the U.S. national phase of PCT Application No. PCT/CN2016/073996 filed on Feb. 18, 2016, which claims priority to Chinese Patent Application No. 201510160727.0 filed on Apr. 7, 2015, the disclosures of which are incorporated in their entirety by reference herein.

TECHNICAL FIELD

The present disclosure relates to the field of display technology, in particular to a flexible display device.

BACKGROUND

Along with the development of the display technology, flexible display devices have been widely applied. However, usually the conventional flexible display device includes a display panel formed into a curved shape, and it may be provided in one usage state, i.e., it is merely of a single structural form.

SUMMARY

(1) Technical Problem to be Solved

An object of the present disclosure is to provide a display device, so as to provide the display device with different usage states through characteristics of a flexible display device, thereby to improve a usage effect of the display device and meet the user's requirements.

(2) Technical Solution

The present disclosure provides in some embodiments a display device including a display panel and a touch panel. At least one of the display panel and the touch panel is made of a flexible material. The display device is capable of being switched between a first usage state where a portion of the touch panel overlaps a portion of the display panel so that a touch operation is capable of being performed, through the touch panel, on at least a portion of an image displayed on the display panel, and a second usage state where the display panel is located at a side of the touch panel and does not overlap the touch panel and a button pattern is formed on the touch panel and an operation is performed on the image displayed on the display panel through the button pattern.

In a possible embodiment of the present disclosure, in the first usage state, the portion of the display panel is an image display region, and the entire image display region overlaps the portion of the touch panel.

In a possible embodiment of the present disclosure, in the first usage state, the portion of the display panel is an image display region, a first portion of the image display region overlaps the portion of the touch panel, and a second portion of the image display region does not overlap the touch panel.

In a possible embodiment of the present disclosure, the display panel is made of a flexible material. The display device further includes a rotatable shaft. In the first usage state, the display panel is arranged around the rotatable shaft. Through the rotation of the rotatable shaft, the display panel is switched between the first usage state and the second usage state.

In a possible embodiment of the present disclosure, the display device further includes a rigid bracket which includes a fixation structure and a slidable structure. In the case that the rigid bracket is in a first state, the slidable structure includes a first portion overlapping the fixation structure, a second portion arranged parallel to the first portion, and a third portion connecting the first portion to the second portion. In the case that the rigid bracket is in a second state, the first portion of the slidable structure is located at a side of the fixation structure and does not overlap the fixation structure. A first edge of the display panel is connected to one end of the second portion of the slidable structure away from the fixation structure, and a second edge of the display panel away from the first edge is slidably arranged within a groove. In the first usage state, the rigid bracket is in a first state, and in the case that the display device is switched from the first usage state to the second usage state, the rigid bracket is switched from the first state to a second state and the slidable structure drives the second edge of the display panel to slide in the groove.

In a possible embodiment of the present disclosure, in the case that the rigid bracket is switched from the first state to the second state, the slidable structure drives the first edge of the display panel to move in a first direction, and drives the second edge of the display panel to move within the groove in a second direction opposite to the first direction and to move out of the groove and then move in the first direction.

In a possible embodiment of the present disclosure, the second edge of the display panel is secured onto a guide rail structure adaptively connected to the groove. The display device further includes a stopping unit configured to, in the case that the second edge of the display panel is driven by the guide rail structure to move in the first direction and the entire display panel is spread to be located at a side of the touch panel, prevent the guide rail structure from moving in the first direction further.

In a possible embodiment of the present disclosure, the display device further includes a plate on which a plurality of light sources is arranged at intervals. In the second usage state, the plate is arranged opposite to the touch panel, and light beams from the light sources reach the touch panel to form the button pattern.

In a possible embodiment of the present disclosure, the display device further includes a lens system arranged between the plate and the touch panel and configured to enable the light beams from the light sources to reach a plane where the touch panel is located.

In a possible embodiment of the present disclosure, the touch panel is arranged fixedly, and includes a first touch region portion in a flat state and a second touch region portion in a curved state with the rotatable shaft as a center.

In a possible embodiment of the present disclosure, in the first usage state, the display panel includes a first display region and a second display region each in a flat state and arranged parallel to each other, and a third display region in a curved state with the rotatable shaft as a center and located between the first display region and the second display region. In the second usage state, the first display region, the second display region and the third display region are spread to be in a substantively identical plane.

(3) Beneficial Effect

According to the embodiments of the present disclosure, at least one of the display panel and the touch panel is made of a flexible material, so as to enable the at least one of the display panel and the touch panel to be in various states, thereby to switch the display device between the first usage state where the touch operation is capable of being performed through the touch panel on the image displayed on the display panel, and the second usage state where the operation is capable of being performed through the button pattern formed on the touch panel on the image displayed on the display panel. As a result, through the flexibility characteristics, it is able to provide the display device with different usage states, thereby to improve the usage effect of the display device and meet the user's requirements.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
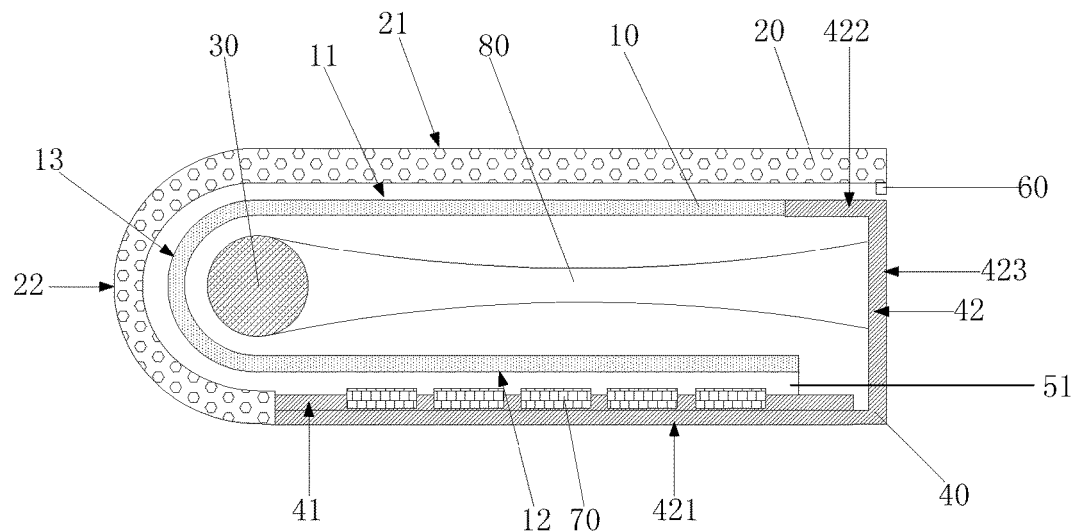
FIG. 1 is a sectional view of a display device in a first usage state according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments a display device including a display panel and a touch panel. At least one of the display panel and the touch panel is made of a flexible material. The display device is capable of being switched between a first usage state and a second usage state. In the first usage state, a portion of the touch panel overlaps a portion of the display panel so that a touch operation is capable of being performed, through the touch panel, on at least a portion of an image displayed on the display panel. In the second usage state, the display panel is located at a side of the touch panel and does not overlap the touch panel and a button pattern is formed on the touch panel through which an operation is performed on the image displayed on the display panel.

According to the display device in the embodiments of the present disclosure, at least one of the display panel and the touch panel is made of a flexible material, so as to enable the at least one of the display panel and the touch to be in various states, thereby to switch the display device between the first usage state where the touch operation is capable of being performed through the touch panel on the image displayed on the display panel (i.e., a usage state similar to that of a common touch-screen mobile phone), and the second usage state where the operation is capable of being performed through the button pattern formed on the touch panel on the image displayed on the display panel (i.e., a usage state similar to that of a game machine). As a result, through the flexibility characteristics, it is able to provide the display device with different usage states, thereby to improve the usage effect of the display device and meet the user's requirements.

In the embodiments of the present disclosure, the display panel has an image display function. The touch panel is a transparent material layer and capable of sensing a touch operation made on its surface. The present disclosure is not focused on the flexible material for forming the display panel and/or touch panel. In addition, as is known in the art, the display panel and the touch panel may be made of a flexible material so as to form a curved structure. For example, the display panel may be an organic light-emitting diode (OLED) display panel. Hence, this will not be particularly described herein.

For the display device in the embodiments of the present disclosure, at least one of the display panel and the touch panel may be made of a flexible material and provided with a structure capable of moving between different positions. Based on this, the display device may be at least switched among the following usage states.

1. A portion of the display panel forms an image display region, and the entire image display region overlaps a portion of the touch panel. In other words, the entire image display region may be covered with the touch panel, and the touch operation may be performed on the image displayed at the entire image display region through the touch panel.

2. A portion of the display panel forms the image display region, a first portion of the image display region overlaps the portion of the touch panel, and a second portion of the image display region does not overlap the touch panel. In other words, the touch operation may be merely performed on a portion of the image displayed at the entire image display region, and no touch operation may be performed on the other portion of the image.

3. The entire display panel is spread to be located at a side of the touch panel and does not overlap the touch panel. The button pattern may be formed on the touch panel, and the operation may be performed on the image displayed on the display panel through the button pattern.

The structure of the display device will be described hereinafter in conjunction with the drawings.

Referring to FIG. 1, the display device in the embodiments of the present disclosure includes a display panel 10 and a touch panel 20. Each of the display panel 10 and the touch panel 20 is made of a flexible material, and may be formed into a curved shape. To be specific, the display panel 10 and the touch panel 20 may be arranged on the basis of a housing (not shown), and a rotatable shaft 30 is arranged along the housing and at a position adjacent to a lateral surface of the housing. The display panel 10 and the touch panel 20 are each arranged around the rotatable shaft 30.

In the embodiments of the present disclosure, the touch panel 20 is arranged fixedly, and includes a first touch region portion 21 in a flat state and a second touch region portion 22 in a curved state with the rotatable shaft 30 as a center. The two touch region portions are provided on the basis of different states of the two touch region portions. In fact, the first touch region portion 21 and the second touch region portion 22 may be formed integrally, and there is no actual dividing line therebetween.

Based on the structure of the touch panel 20, the display panel 10 may be arranged movably. In the first usage state, the display panel 10 is arranged around the rotatable shaft 30, and through the rotatable shaft 30, the display panel 10 may be switched between the first usage state and the second usage state.

Figure 2:
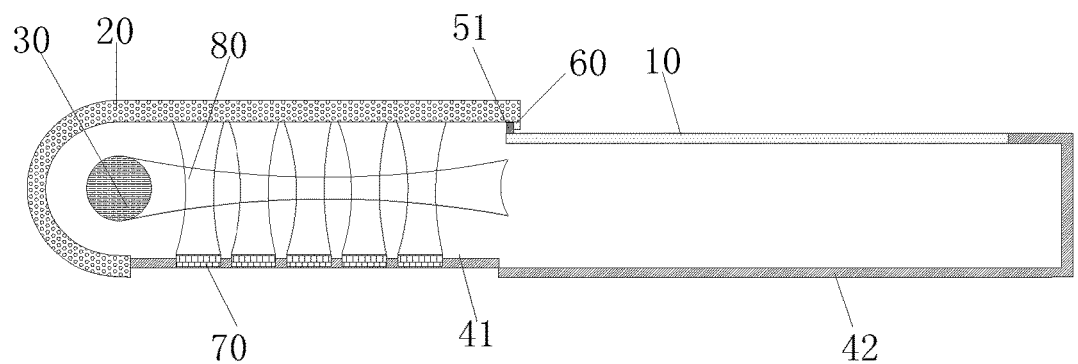
FIG. 2 is a sectional view of the display device in a second usage state according to one embodiment of the present disclosure.

To be specific, as shown in FIG. 1, in the first usage state, the display panel 10 includes a first display region 11 and a second display region 12 each in a flat state and arranged parallel to each other, and a third display region 13 in a curved state with the rotatable shaft 30 as a center and located between the first display region 11 and the second display region 12. As shown in FIG. 2, in the second usage state, the first display region 11, the second display region 12 and the third display region 13 are spread so as to be in an identical plane, and arranged at a side of the first touch region portion 21 of the touch panel 20, i.e., so as not to overlap the first touch region portion 21.

Identically, in the first usage state, the division of the display panel 10 into three display regions is made on the basis of the different states of the three display regions. In fact, these three display regions may be formed integrally, and there is no actual dividing line between any two of the three display regions.

In addition, actions of the display panel 10 between the first usage state and the second usage state will be described hereinafter with reference to FIGS. 1 to 4.

To be specific, in the embodiments of the present disclosure, the display device further includes a rigid bracket 40 which includes a fixation structure 41 and a slidable structure 42. The slidable structure 42 is capable of sliding relative to the fixation structure 41. As shown in FIG. 1, in the case that the rigid bracket 40 is in a first state, the slidable structure 42 includes a first portion 421 overlapping the fixation structure 41, a second portion 422 arranged parallel to the first portion 421, and a third portion 423 connecting the first portion 421 to the second portion 422. As shown in FIG. 2, in the case that the rigid bracket 40 is in a second state, the first portion 421 of the slidable structure 42 is located in a plane substantively identical to the fixation structure 41.

Figure 4:
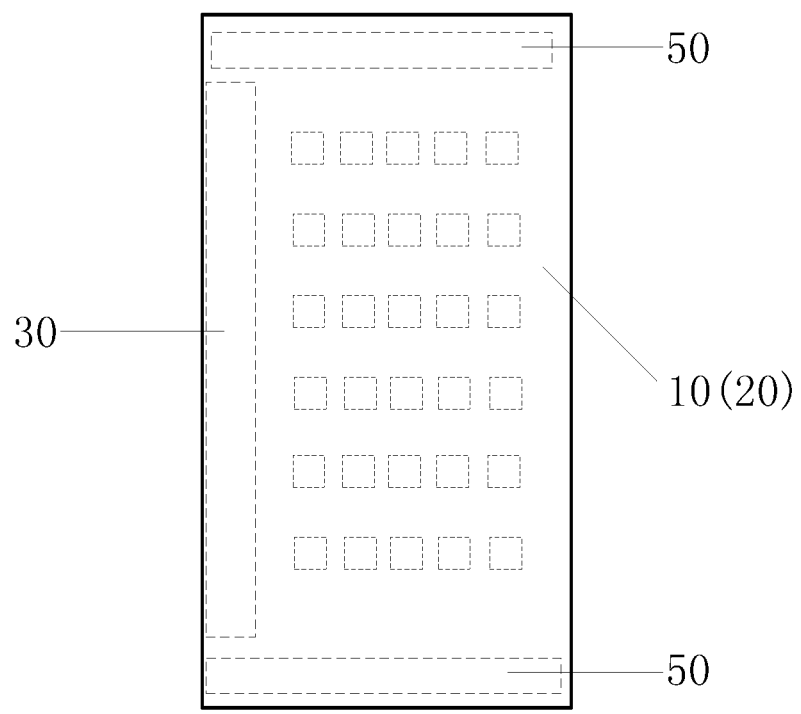
FIG. 4 is a perspective view of the display device in the first usage state according to one embodiment of the present disclosure.

In addition, a first edge of the display panel 40 is connected to one end of the second portion 422 of the slidable structure 42 away from the fixation structure 41, and a second edge of the display panel 40 away from the first edge is slidably arranged within a groove 50 (as shown in FIG. 4).

Referring to FIG. 4, the groove 50 may be arranged in the housing of the display device and perpendicular to the rotatable shaft 30. In addition, two grooves 50 may be provided corresponding to two ends of the rotatable shaft 30. To be specific, the second edge of the display panel 10 is secured onto a guide rail structure 51 which is slidably arranged within the groove 50 and adaptively connected to the groove 50.

As shown in FIG. 1, in the case that the display device is in the first usage state, the rigid bracket 40 is in the first state. In the case that the display device is switched from the first usage state to the second usage state, as shown in FIG. 2, the rigid bracket 40 is switched from the first state to the second state so that the slidable structure 42 drives the second edge of the display panel 10 to slide in the groove 50.

Figure 3:
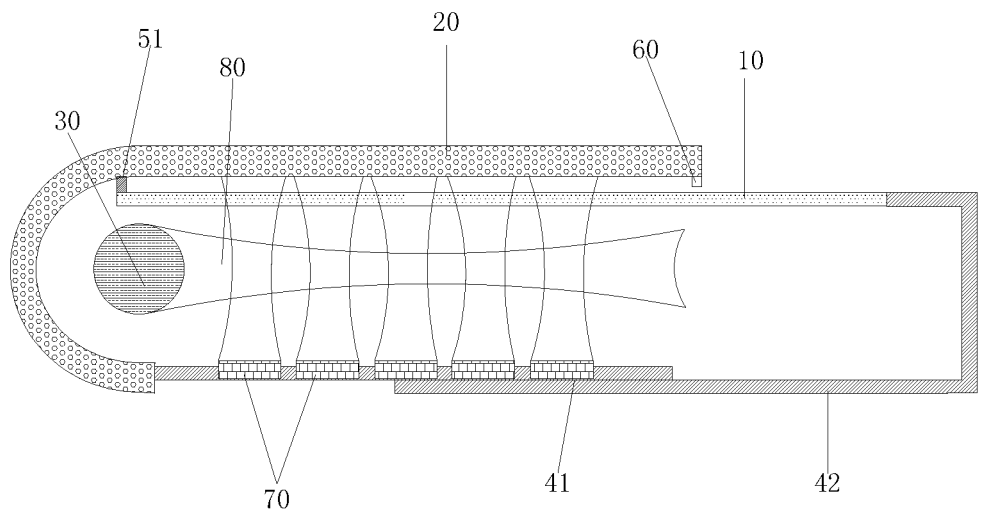
FIG. 3 is a sectional view of the display device in a third usage state according to one embodiment of the present disclosure.

Based on the above structure, as shown in FIG. 1, in the case that the display device is in the first usage state, the rigid bracket 40 is in the first state, i.e., the first portion 421 of the slidable structure 42 overlaps the fixation structure 41 of the rigid bracket 40. At this time, a portion of the slidable structure 42 is located below the fixation structure 41, and thereby the entire display panel 10 is located below the touch panel 20. During the display device is switched from the first usage state to the second usage state, the rigid bracket 40 is switched from the first state to the second state. At this time, the slidable structure 42 moves in a direction away from the rotatable shaft 30 (first direction) relative to the fixation structure 41, so it may drive the first edge of the display panel 10 to move in the first direction. Because the second edge of the display panel 10 is slidably arranged within the groove 50 through the guide rail structure 41, the entire display panel 10 may rotate around the rotatable shaft 30 and the second edge of the display panel 10 may move in a second direction opposite to the first direction. FIG. 3 shows the display device in the third usage state during the switching process from the first usage state to the second usage state. A portion of the display panel 10 above the rotatable shaft 30 and below the first touch region portion 21 of the touch panel 20 may increase gradually, and the display panel 10 may move outwardly relative to the touch panel 20. The slidable structure 42 continues to move in the first direction, until the first portion 421 of the entire slidable structure 42 is located in a plane substantively identical to the fixation structure 41. At this time, the display panel 10 may rotate around the rotatable shaft 30 to a position where the entire display region portion moves beyond the touch panel 20, i.e., the display device may be in the second usage state as shown in FIG. 2.

In addition, in the embodiments of the present disclosure, the first portion 421 of the slidable structure 42 overlapping the fixation structure 41 may consist of a plurality of folded sections. In this way, in the case that the display panel 10 needs to be spread, the sections of the first portion 421 may move to be in an identical plane and located at a side of the fixation structure 41, thereby to enable the display device to be in the second usage state, as shown in FIG. 2.

In the case that the display device is switched from the first usage state to the second usage state, the rigid bracket 40 may be switched from the first state to the second state. At this time, the slidable structure 42 may drive the first edge of the display panel 10 in the first direction (in a direction away from the rotatable shaft 30), and drive the second edge of the display panel 10 to move within the groove in the second direction opposite to the first direction and to move out of the groove 50 and then move in the first direction.

In a possible embodiment of the present disclosure, as shown in FIGS. 1 to 3, the display device further includes a stopping unit 60 arranged on the housing of the display device, and configured to, in the case that the second edge of the display panel 10 is driven by the guide rail structure 51 to move in the first direction and the entire display panel 10 is spread to be located at a side of the touch panel 20, prevent the guide rail structure 51 from moving in the first direction further.

Figure 7:
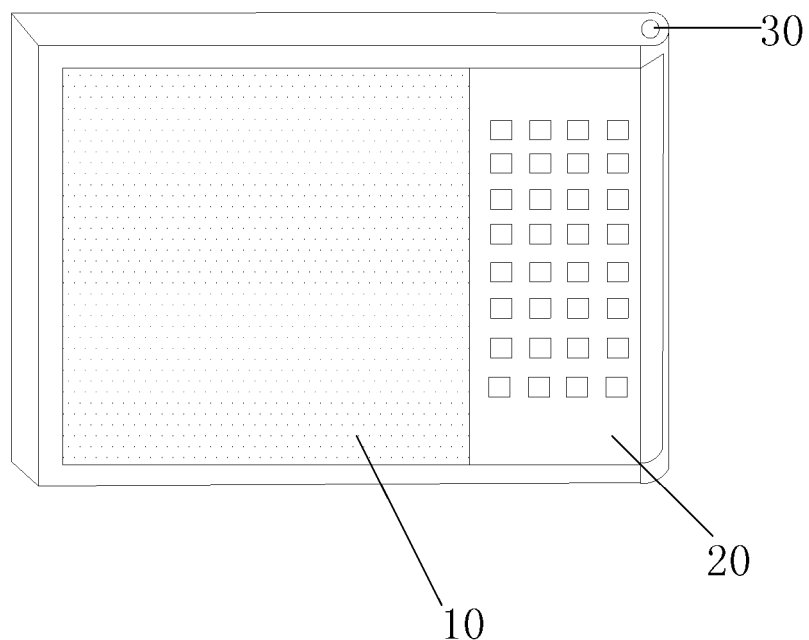
FIG. 7 is a solid view of the display device in the second usage state according to one embodiment of the present disclosure.

In addition, the display device may further include a plate on which a plurality of light sources 70 is arranged at intervals. In the second usage state, as shown in FIG. 2, the plate is arranged opposite to the touch panel 20, and light beams from the light sources 70 reach the touch panel 20 so as to form the button pattern. In the embodiments of the present disclosure, the fixation structure 41 of the rigid bracket 40 is formed as the plate, i.e., the fixation structure 41 is arranged opposite to the first touch region portion 21 of the touch panel 20. In the second usage state, the light beams from the light sources on the fixation structure 41 may reach the first touch region portion 21, so as to form the button pattern (as shown in FIG. 7).

In a possible embodiment of the present disclosure, the display device may further include a lens system 80 arranged between the plate and the touch panel 20 and configured to enable the light beams from the light sources 70 to reach a plane where the touch panel 20 is located.

The display device obtained on the basis of the principle mentioned in the embodiments of the present disclosure may be provided with various structures, including the structure as shown in FIGS. 1 to 3. Based on the structure as shown in FIGS. 1 to 3, any other modifications may be made by a person skilled in the art, which also fall within the scope of the present disclosure and which will not be particularly defined herein.

In the embodiments of the present disclosure, the display device with the above structure may be in at least three usage states.

Figure 5:
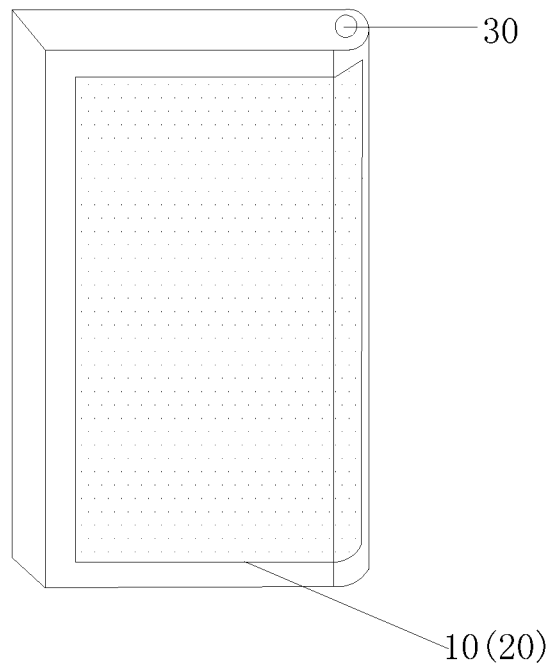
FIG. 5 is a solid view of the display device in the first usage state according to one embodiment of the present disclosure.

As shown in FIGS. 1 and 5, in the first usage state, the display panel 10 is completely located below the touch panel 20. The first display region 11 and the third display region 13 of the display panel 10 may be the image display region, and the entire touch panel 20 may be arranged corresponding to, i.e., overlap, the first display region 11 and the third display region 13. At this time, the entire image display region may be covered with the touch panel 20, through which the touch operation may be performed on the image displayed at the first display region 11 and the third display region 13.

Figure 6:
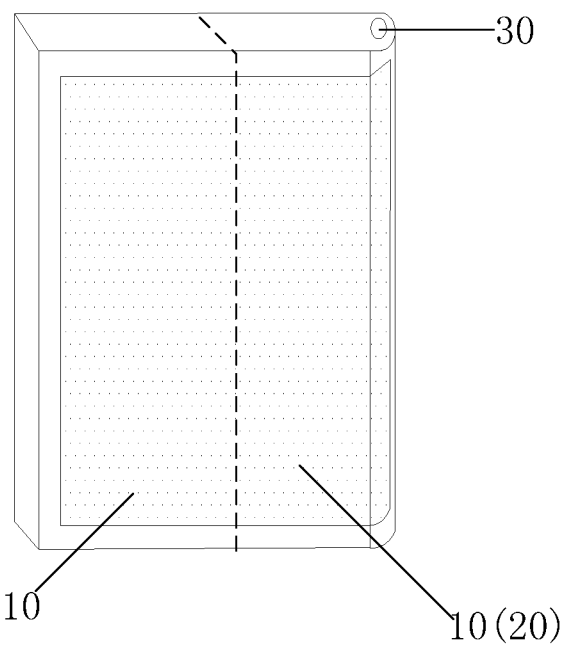
FIG. 6 is a solid view of the display device in the third usage state according to one embodiment of the present disclosure.

As shown in FIGS. 3 and 6, in the third usage state, a portion of the display panel 10 is moved outwardly from below the touch panel 20, and the display region increases. The entire display panel 10 is the image display region (or a portion of the display region is the image display region), but merely a portion of the image display region is arranged corresponding to, i.e., overlaps, a portion of the touch panel 20, with the other portion of the image display region not overlapping the touch panel. Based on this structure, as shown in FIG. 6, the touch operation may be performed on the image displayed at the portion of the image display region overlapping the touch panel, rather than on the image displayed at the other portion of the image display region not overlapping the touch panel.

As shown in FIGS. 2 and 7, in the second usage state, the entire display panel 10 is moved outwardly from below the touch panel 20, and the display region further increases. However, the entire display panel 10 does not overlap the touch panel 20, and no touch operation may be performed. At this time, the light beams from the light sources 70 may reach the touch panel 20 to form the button pattern, which may be clicked so as to perform the operation on the image displayed on the display panel 10 in accordance with a predetermined control command, thereby to enable a user to play games or perform any operations using a virtual keyboard on the display device.

According to the embodiments of the present disclosure, through the flexibility characteristics of the display panel and the touch panel, it is able to provide the display device with different usage states, thereby to improve the usage effect of the display device and meet the user's requirements.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A display device, comprising a display panel; and a touch panel, wherein at least one of the display panel and the touch panel is made of a flexible material, and the display device is capable of being switched between a first usage state and a second usage state;

wherein in the first usage state, a portion of the touch panel overlaps a portion of the display panel so that a touch operation is capable of being performed, through the touch panel, on at least a portion of an image displayed on the display panel;

wherein in the second usage state, the display panel is located at a side of the touch panel and does not overlap the touch panel, a button pattern is formed on the touch panel, and an operation is performed on the image displayed on the display panel through the button pattern;

wherein the display device further comprises a rigid bracket including a fixation structure and a slidable structure;

wherein, in the case that the rigid bracket is in a first state, the slidable structure comprises a first portion overlapping the fixation structure, a second portion arranged parallel to the first portion, and a third portion connecting the first portion to the second portion; in the case that the rigid bracket is in a second state, the first portion of the slidable structure is located at a side of the fixation structure and does not overlap the fixation structure;

wherein a first edge of the display panel is connected to one end of the second portion of the slidable structure away from the fixation structure, and a second edge of the display panel away from the first edge is slidably arranged within a groove; and wherein in the first usage state, the rigid bracket is in a first state, and in the case that the display device is switched from the first usage state to the second usage state, the rigid bracket is switched from the first state to a second state and the slidable structure drives the second edge of the display panel to slide in the groove.

2. The display device according to claim 1, wherein in the first usage state, the portion of the display panel is an image display region, and the entire image display region overlaps the portion of the touch panel.

3. The display device according to claim 2, further comprising a rotatable shaft, wherein the display panel is made of a flexible material;
   the display panel is arranged around the rotatable shaft in the first usage state; and
   the display panel is switched between the first usage state and the second usage state through the rotation of the rotatable shaft.

4. The display device according to claim 2, further comprising a plate on which a plurality of light sources is arranged at intervals, wherein in the second usage state, the plate is arranged opposite to the touch panel, and light beams from the light sources reach the touch panel to form the button pattern.

5. The display device according to claim 1, wherein in a third usage state, the portion of the display panel is an image display region, a first portion of the image display region overlaps the portion of the touch panel, and a second portion of the image display region does not overlap the touch panel.

6. The display device according to claim 5, further comprising a rotatable shaft, wherein the display panel is made of a flexible material;
   the display panel is arranged around the rotatable shaft in the first usage state; and
   the display panel is switched between the first usage state and the second usage state through the rotation of the rotatable shaft.

7. The display device according to claim 5, further comprising a plate on which a plurality of light sources is arranged at intervals, wherein in the second usage state, the plate is arranged opposite to the touch panel, and light beams from the light sources reach the touch panel to form the button pattern.

8. The display device according to claim 1, further comprising a rotatable shaft, wherein the display panel is made of a flexible material;
   the display panel is arranged around the rotatable shaft in the first usage state; and
   the display panel is switched between the first usage state and the second usage state through the rotation of the rotatable shaft.

9. The display device according to claim 8, wherein the touch panel is arranged fixedly, and comprises a first touch region portion in a flat state and a second touch region portion in a curved state with the rotatable shaft as a center.

10. The display device according to claim 9, wherein in the first usage state, the display panel comprises a first display region and a second display region each in a flat state and arranged parallel to each other, and a third display region in a curved state with the rotatable shaft as a center and located between the first display region and the second display region; and
   in the second usage state, the first display region, the second display region and the third display region are spread to be in a substantively identical plane.

11. The display device according to claim 1, wherein in the case that the rigid bracket is switched from the first state to the second state, the slidable structure drives the first edge of the display panel to move in a first direction, and drives the second edge of the display panel to move within the groove in a second direction opposite to the first direction and to move out of the groove and then move in the first direction.

12. The display device according to claim 11, wherein the second edge of the display panel is secured onto a guide rail structure adaptively connected to the groove, and
   the display device further comprises a stopping unit configured to, in the case that the second edge of the display panel is driven by the guide rail structure to move in the first direction and the entire display panel is spread to be located at a side of the touch panel, prevent the guide rail structure from moving in the first direction further.

13. The display device according to claim 1, further comprising a plate on which a plurality of light sources is arranged at intervals, wherein in the second usage state, the plate is arranged opposite to the touch panel, and light beams from the light sources reach the touch panel to form the button pattern.

14. The display device according to claim 13, further comprising a lens system arranged between the plate and the touch panel and configured to enable the light beams from the light sources to reach a plane where the touch panel is located.

* * * * *